(12) United States Patent
Sanuki et al.

(10) Patent No.: US 11,579,796 B2
(45) Date of Patent: Feb. 14, 2023

(54) MEMORY SYSTEM

(71) Applicant: Kioxia Corporation, Tokyo (JP)

(72) Inventors: Tomoya Sanuki, Yokkaichi (JP); Yuta Aiba, Yokohama (JP); Hitomi Tanaka, Ota (JP); Masayuki Miura, Yokkaichi (JP); Mie Matsuo, Yokkaichi (JP); Toshio Fujisawa, Yokohama (JP); Takashi Maeda, Kamakura (JP)

(73) Assignee: Kioxia Corporation, Tokyo (JP)

( * ) Notice: Subject to any disclaimer, the term of this patent is extended or adjusted under 35 U.S.C. 154(b) by 52 days.

(21) Appl. No.: 17/197,667

(22) Filed: Mar. 10, 2021

(65) Prior Publication Data
US 2022/0011963 A1 Jan. 13, 2022

(30) Foreign Application Priority Data
Jul. 7, 2020 (JP) .............................. JP2020-117214

(51) Int. Cl.
*G06F 3/00* (2006.01)
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
None
See application file for complete search history.

(56) References Cited

U.S. PATENT DOCUMENTS

| | | |
|---|---|---|
| 6,643,919 B1 | 11/2003 | Huang |
| 7,369,377 B1 | 5/2008 | Hennessy et al. |
| 7,911,265 B2 | 3/2011 | Dzurak et al. |
| 2014/0240913 A1 | 8/2014 | Vyshetsky |
| 2015/0263005 A1 | 9/2015 | Zhao. et al. |
| 2017/0030777 A1* | 2/2017 | Kimura ................. G01K 1/022 |
| 2018/0168070 A1 | 6/2018 | Ware et al. |
| 2019/0164985 A1 | 5/2019 | Lee et al. |
| 2020/0126612 A1 | 4/2020 | Mayer et al. |

FOREIGN PATENT DOCUMENTS

JP 2019-96866 A 6/2019

OTHER PUBLICATIONS

Song, M. et al., "Evaluation of Commercial-Off-The-Shelf (COTS) Electronics for Extreme Cold Environments," Aerospace Conference, 2018, 12 pages.
Lee, G-H. et al., "Cryogenic Computer Architecture Modeling with Memory-Side Case Studies," ISCA '19, Jun. 22-26, 2019, 14 pages.
Chakraborty, W. et al., "An Empirically Validated Virtual Source FET Model for Deeply Scaled Cool CMOS," IEDM, 2019, 4 pages.

(Continued)

*Primary Examiner* — Midys Rojas
(74) *Attorney, Agent, or Firm* — Oblon, McClelland, Maier & Neustadt, L.L.P.

(57) ABSTRACT

A memory system has a memory, a first substrate on which the memory is mounted and which is set to a temperature of −40[° C.] or lower, a controller configured to control the memory; and a second substrate on which the controller is mounted, which is set to a temperature of −40[° C.] or higher, and which transmits and receives a signal to and from the first substrate via a signal transmission cable.

16 Claims, 16 Drawing Sheets

(56) References Cited

OTHER PUBLICATIONS

Bae, J-H. et al., "Characterization of a Capacitorless DRAM Cell for Cryogenic Memory Applications," IEEE Electron Device Letter, vol. 40, No. 10, Oct. 2019, 4 pages.

Wang, F. et al., DRAM Retention at Cryogenic Temperatures, IMW, 2018, 4 pages.

Tannu, S. S. et al., "Cryogenic-DRAM based Memory System for Scalable Quantum Computers: A Feasibility Study," MEMSYS, 2017, 7 pages.

Ware, F. et al., "Do Superconducting Processors Really Need Cryogenic Memories? The Case for Cold Dram," MEMYS, 2017, 6 pages.

Ihmig, F. R. et al., "Batch screening of commercial serial flash-memory integrated circuits for low-temperature applications," CRYOGENICS, vol. 71, 2015, 8 pages.

Shin, M. et al., "Low temperature characterization of 14nm FDSOI CMOS devices," IEEE, 2014, 4 pages.

Beckers, A. et al., "Cryogenic MOS Transistor Model," IEEE Transactions on Electronic Devices, 2018, 9 pages.

Kelly, T. et al., "Some Like It Cold: Initial Testing Results for Cryogenic Computing Components," Journal of Physics: Conference Series, 1182 Feb. 12, 2004, 2019, 10 pages.

\* cited by examiner

1c : MEMORY SYSTEM

MEMORY SYSTEM

CROSS REFERENCE TO RELATED APPLICATIONS

This application is based upon and claims the benefit of priority from the prior Japanese Patent Application No. 2020-117214, filed on Jul. 7, 2020, the entire contents of which are incorporated herein by reference.

FIELD

One embodiment of the present invention relates to a memory system.

BACKGROUND

Memories and storage used in electronic devices used in a large temperature fluctuation environment and an extremely low temperature environment are required to be operated stably.

DETAILED DESCRIPTION

Figure 1:
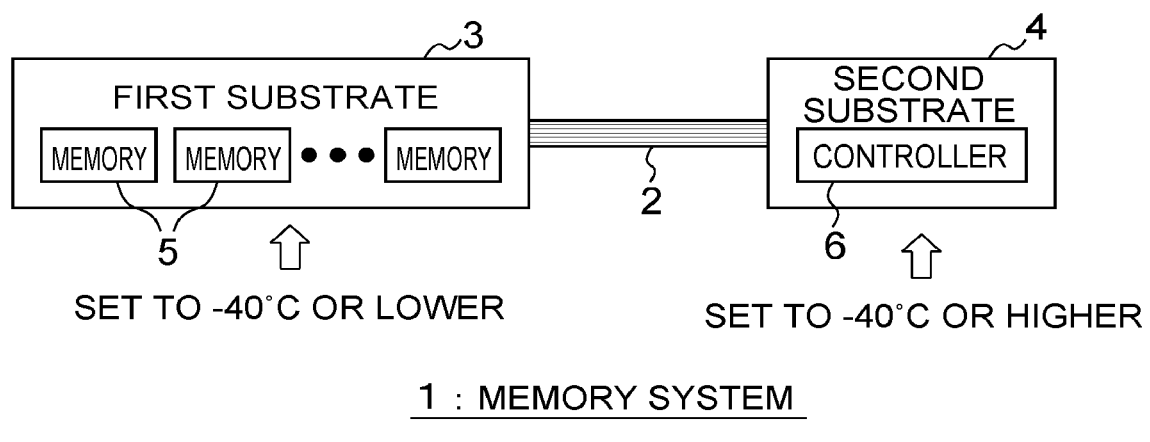
FIG. 1 is a diagram illustrating a schematic configuration of a memory system 1 according to an embodiment.

According to one embodiment, a memory system has:
a memory;
a first substrate on which the memory is mounted and which is set to a temperature of −40[° C.] or lower;
a controller configured to control the memory; and
a second substrate on which the controller is mounted, which is set to a temperature of −40[° C.] or higher, and which transmits and receives a signal to and from the first substrate via a signal transmission cable.

It is generally known that the lower the temperature of a substance, the higher its electrical conductivity. In particular, at an extremely low temperature of 77[K] (Kelvin) or lower, which is the boiling point temperature of liquid nitrogen, the electrical conductivity of a conductor is sharply increased, and electronic states (information by electrical signals) can be transmitted without loss or noise. Against this background, for example, in quantum computers, it is being considered to operate an arithmetic processing circuit at an extremely low temperature, and the memory and storage accessed by the arithmetic processing circuit are also required to be operated at an extremely low temperature in order to prevent heat transfer to the arithmetic processing circuit.

In addition, although space development is in progress, the temperature of outer space significantly differs between in a case where sunlight is applied and in a case where sunlight is not applied, and the memory and storage used for electronic devices used in outer space are required to withstand large temperature fluctuations and to be operated stably even at an extremely low temperature.

The bit unit price of storage is decreased year by year, and at present, the bit unit price of the solid state drive (SSD) with a built-in NAND flash memory is getting cheaper. For this reason, it is desirable that SSDs can be used for storage used at an extremely low temperature.

In such a situation, for example, with respect to storage such as an SSD, it is desired to establish a technique for stably operating the storage at an extremely low temperature with low cost.

The memory system according to one embodiment described below can be used as 1) storage for quantum computing, 2) storage with a minimum bit unit price, and 3) storage for the space industry. Before the configuration and operation of the memory system according to the present embodiment are described, the outline of the 1) storage to 3) storage described above will be described.

1) Storage for Quantum Computing

Quantum computers have much higher computing power than existing computers, but it is premised that the central processing unit (CPU) of the quantum computer is operated at an extremely low temperature of m[K] less than 1[K]. However, in reality, it is difficult to operate the CPU in the related art at an extremely low temperature of m[K]. As an alternative, the development of arithmetic processing circuits such as Josephson junction type elements that are operated at about 4[K] is in progress. In a case where wiring is connected to an arithmetic processing circuit that is operated at an extremely low temperature, heat conduction occurs and the ambient temperature of the arithmetic processing circuit is increased, but at about 4[K], it is expected that heat conduction can be suppressed and the extremely low temperature can be maintained.

It is necessary to connect memory and storage to the arithmetic processing circuit such as the CPU. From the viewpoint of suppressing signal transmission loss and heat conduction, it is desirable to set the memory and storage to the same temperature (for example, 4[K]) as the CPU. However, it is difficult to operate memory and storage at a temperature of 4[K]. CMOS circuits and memory elements used in the memory and storage cannot be operated in the same way as those in the related art because they are not operated at 4[K] or their characteristics are significantly different. However, the memory and storage can be operated at 77[K], as described below. In a case where the CPU of the quantum computer is operated at 4[K], for example, when the memory is mounted on a board different from the CPU and set to, for example, 77[K], the CPU and the memory can be arranged so that the heat from the memory is not transferred to the CPU. Therefore, one of the features of the memory system according to the present embodiment is that the memory can be operated normally and stably even at an extremely low temperature of about 77[K].

2) Storage with Minimum Bit Unit Price

Various technological developments for quantum computers are in progress for practical use, and it is expected that the demand for the memory that can read and write stably at an extremely low temperature will be increased more and more. There are various types of memory and storage with different operating principles, but since the amount of data handled is increased year by year, it is required to stably operate the memory with the minimum bit unit price at an extremely low temperature. At present, it is said that the NAND flash memory used for the SSD has a lower bit unit price than other memories and various recording devices. Therefore, one of the features of the memory system according to the present embodiment is that the NAND flash memory is stably operated at an extremely low temperature (for example, 77[K]). As will be described later, the memory used in the memory system according to the present embodiment is not necessarily limited to the NAND flash memory, but even in a case where the NAND flash memory is used, the NAND flash memory can be used stably at an extremely low temperature.

3) Storage for Space Industry

In outer space, the temperature fluctuates greatly from near −200[° C.] to over 100[° C.] in places where sunlight is not applied and where sunlight is applied. The electronic devices used in outer space are designed to withstand large temperature fluctuations, and have heaters and cooling devices inside, and the internal electronic components can be operated in an environment close to room temperature, but there is a problem that the entire device including the temperature control becomes complicated and the cost is increased. The space development is expected to progress further in the future, and there is a demand for the memory that is as easy to control as possible, keeps costs down, and is operated stably.

The memory system that can also be used as the 1) storage to 3) storage described above will be described in detail below. FIG. 1 is a diagram illustrating a schematic configuration of a memory system 1 according to an embodiment. As illustrated in FIG. 1, the memory system 1 according to the embodiment includes a first substrate 3 and a second substrate 4 that are connected to each other by a signal transmission cable 2. The types of the first substrate 3 and the second substrate 4 are not particularly limited, but are, for example, a printed circuit board, a glass substrate, or the like. The type and length of the signal transmission cable 2 are not limited, but the signal transmission cable 2 has a length of, for example, several tens of centimeters or more. The signal transmission cable 2 may be, for example, a flexible printed circuit (FPC), or another signal transmission cable 2, for example, a Universal Serial Bus (USB) signal transmission cable 2. The reason that the signal transmission cable is set to have several tens of centimeters or more is to prevent heat transfer between the first substrate 3 and the second substrate 4.

A memory 5 is mounted on the first substrate 3, and is set to a temperature of −40[° C.] or lower. Since thermometers and temperature sensors include measurement errors due to environmental conditions or the like, the expression "−40[° C.] or lower" in this specification means to set a target temperature to "−40[° C.] or lower", and due to the measurement errors by the temperature sensor or the like, the temperature may be set to a temperature slightly higher than −40[° C.]. The type of the memory 5 is not limited, but is typically a non-volatile memory such as a NAND flash memory or a NOR flash memory. Various other non-volatile memories, for example, Magnetoresistive Random Access Memory (MRAM), Phase Change RAM (PRAM), Resistive RAM (ReRAM), and the like can also be used as the memory 5. Further, the memory 5 may be a volatile memory 5 such as Dynamic RAM (DRAM). In the following, an example in which a NAND flash memory 100 is used as the memory 5 will be mainly described.

In this specification, the first substrate 3 on which the NAND flash memory is mounted may be called an SSD module. The memory 5 is mounted on the first substrate 3 in a packaged state. A plurality of memory chips 11 may be stacked in one package. In this specification, the package which includes the memory chip and is mounted on the first substrate 3 is collectively referred to as the memory 5. Further, the first substrate 3 on which the memory 5 is mounted may be modularized by being covered with a housing or a resin or the like. In this case, it is assumed that the temperature inside the module is set to −40[° C.] or lower. The reason that the first substrate 3 on which the memory 5 is mounted is set to −40[° C.] or lower is that it is assumed that the memory 5 is operated at an extremely low temperature in the present embodiment. The minimum temperature at which the normal memory 5 guarantees operation is often −40[° C.], but the memory 5 according to the present embodiment is different from the normal memory in that it is assumed that the memory 5 is used at a temperature of −40[° C.] or lower, which is a temperature below the guaranteed operating temperature of the normal memory. The characteristics or the like in a case where the memory 5 is operated at −40[° C.] or lower will be described later. The memory 5 has therein a memory array and a memory controller that is a peripheral circuit for controlling the operation of the memory array, and it has been confirmed by the experiment of the present inventors that the memory controller is operated at 77[K].

A controller 6 is mounted on the second substrate 4, and is set to −40[° C.] or higher. The controller 6 controls writing, reading, or erasing data with respect to the memory 5 in response to an instruction from a host device. The controller 6 is composed of CMOS circuits, the guaranteed operating temperature range is generally −40[° C.] to 125[°

C.], and therefore, those manufactured by the technology used in the SSD products in the related art can be used.

The present inventors conducted operation experiments by immersing a substrate on which an existing NAND flash memory was mounted in liquid nitrogen (77[K], about −196[° C.]). As a result, it was confirmed that the reading operation can be performed normally.

Based on the above experimental results, in the memory system 1 according to the present embodiment, the first substrate 3 on which the memory 5 is mounted is operated at −40[° C.] or lower, which is the guaranteed minimum operating temperature of the normal memory 5.

In the example of FIG. 1, it is assumed that the first substrate 3 on which the memory 5 is mounted is immersed in, for example, liquid nitrogen. Since the liquid nitrogen can be produced at a low cost industrially, immersing the first substrate 3 in the liquid nitrogen itself can be realized at a low cost. Since the first substrate 3 may be set to a temperature of −40[° C.] or lower, the first substrate 3 may be arranged in a refrigerant using the refrigerant other than the liquid nitrogen.

The present inventors also conducted experiments on whether or not the second substrate 4 on which the controller 6 is mounted is also operated at −40[° C.] or lower. Specifically, when a plurality of second substrates 4 on which the controllers 6 were mounted were prepared and each of them was immersed in the liquid nitrogen to perform operation experiments, all the controllers 6 of the second substrates 4 were not operated. The reason for this is that the controller 6 has a built-in logic circuit, and since the logic circuit guarantees operation only up to −40[° C.], it is conceivable that the timing of each signal in the logic circuit was shifted and malfunctioned. Further, even if the controller 6 is operated at −40[° C.] or lower, since the controller 6 controls all the memories 5 mounted on the first substrate 3, heat is likely to occur, and for example, in a case where the second substrate 4 is immersed in the liquid nitrogen, the amount of liquid nitrogen consumed is increased, and the cooling cost is increased.

Therefore, in the present embodiment, the second substrate 4 on which the controller 6 is mounted is set to a temperature of −40[° C.] or higher.

Figure 2:
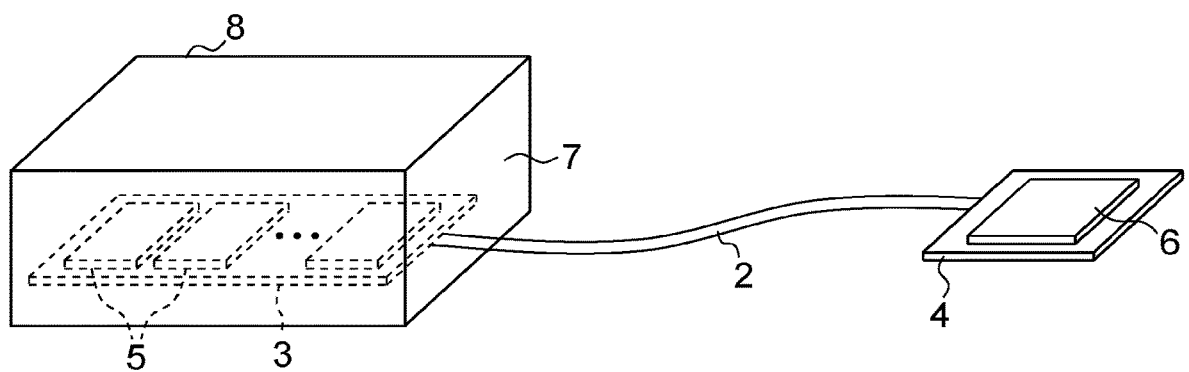
FIG. 2 is a diagram illustrating a schematic configuration of the memory system 1 according to a first modification.

As a specific example in which the first substrate 3 on which the memory 5 is mounted is set to −40[° C.] or lower, it is conceivable to put the first substrate 3 in a housing 8 in which a refrigerant 7 having a temperature of −40[° C.] or lower is housed as in a memory system 1a according to a first modification illustrated in FIG. 2. The refrigerant 7 is, for example, a liquid having a boiling point of −40[° C.] or lower, such as liquid nitrogen or liquid carbon dioxide. Further, it is desirable that the refrigerant 7 is a substance which is harmless to humans and can be obtained at a low price. It is conceivable that the housing 8 is a heat insulating container or the like having an opening as small as possible in order to prevent that the refrigerant 7 comes into contact with the atmosphere so that the temperature of the refrigerant 7 is increased, and to prevent that the refrigerant 7 is diffused into the atmosphere so that the amount of the refrigerant 7 is reduced.

On the other hand, since the second substrate 4 on which the controller 6 is mounted may be set to −40[° C.] or higher, the second substrate 4 may be set to, for example, room temperature without using the refrigerant 7 or the cooling member. However, in a case where there is a risk that the controller 6 generates heat, heat dissipation measures such as bringing a cooling member such as a heat sink into contact with the controller 6 will be taken as appropriate.

Figure 3:
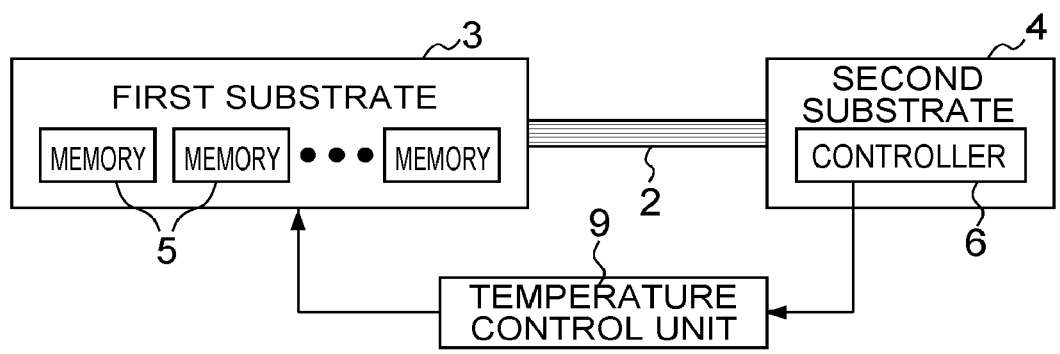
FIG. 3 is a diagram illustrating a schematic configuration of the memory system 1 according to a second modification.

FIG. 3 is a diagram illustrating a schematic configuration of a memory system 1b according to a second modification of FIG. 1. The memory system 1b of FIG. 3 includes a temperature control unit 9 in addition to the first substrate 3 on which the memory 5 is mounted and the second substrate 4 on which the controller 6 is mounted. The temperature control unit 9 controls the first substrate 3 on which the memory 5 is mounted to a temperature of −40[° C.] or lower.

Figure 4:
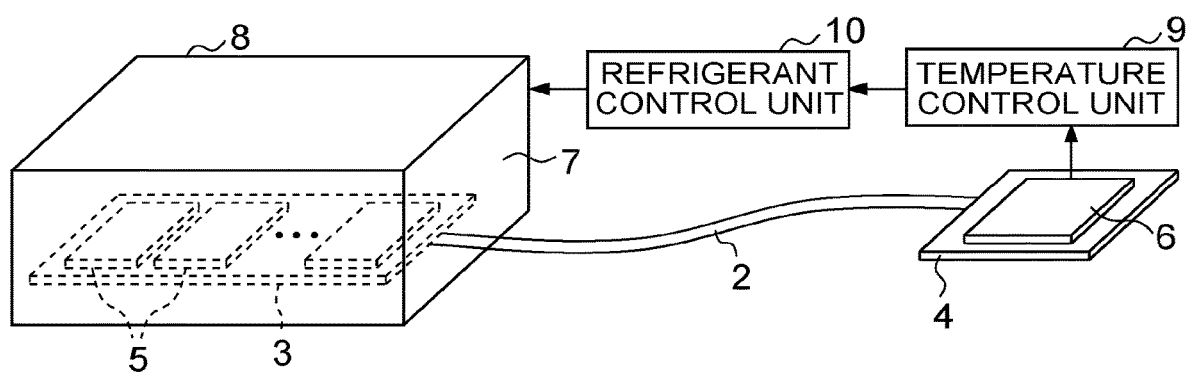
FIG. 4 is a diagram illustrating a schematic configuration of the memory system 1 according to a third modification.

FIG. 4 is a block diagram of a memory system 1c according to a third modification in which the configuration of FIG. 3 is more concrete. In the memory system 1c of FIG. 4, the first substrate 3 is put into the housing 8 in which the refrigerant 7 is housed, and the memory system is includes a refrigerant control unit 10 that controls at least one of the temperature and the amount of the refrigerant 7. As will be described later, the temperature control unit 9 controls the refrigerant control unit 10 on the basis of temperature information from a temperature detector described later which detects the temperature of the first substrate 3 or the memory 5. The refrigerant control unit 10 controls at least one of the temperature and the amount of the refrigerant 7 in the housing 8 so that the temperature of the first substrate 3 becomes −40[° C.] or lower.

Figure 5A:
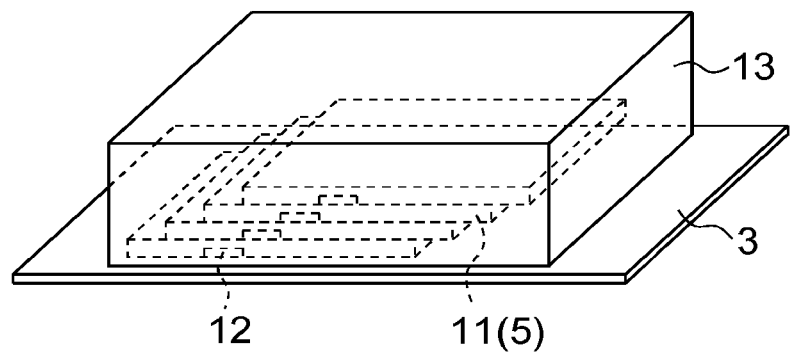
FIG. 5A is a diagram illustrating a first example of a temperature detector 12.
Figure 5B:
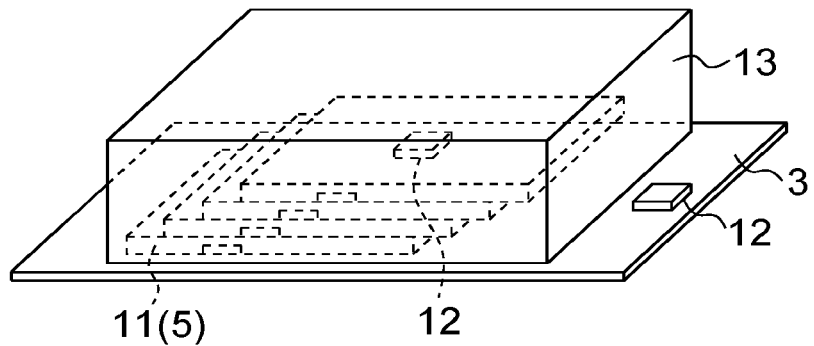
FIG. 5B is a diagram illustrating a second example of the temperature detector 12.

FIG. 5A is a diagram illustrating a first example of a temperature detector 12, and FIG. 5B is a diagram illustrating a second example of the temperature detector 12. In both FIGS. 5A and 5B, the memory 5 is provided in which a plurality of memory chips 11 stacked on the first substrate 3 are covered with a package 13.

The temperature detector 12 of FIG. 5A is built in the memory 5 mounted on the first substrate 3. FIG. 5A illustrates an example in which the plurality of memory chips 11 are stacked on the first substrate 3, but it is not always necessary to provide the temperature detector 12 for each memory chip 11. At an extremely low temperature, the thermal conductivity is improved, so that the temperature difference between the plurality of stacked memory chips 11 becomes small. Therefore, among the plurality of stacked memory chips 11, the temperature detectors 12 are provided to some memory chips 11, and thus the temperature of the memory chip 11 in which the temperature detector 12 is not built can also be estimated accurately.

The temperature detector 12 of FIG. 5A detects the temperature on the basis of, for example, a change in a resistance value of a conductor (for example, a wiring pattern) in the memory chip 11. As a result, the temperature can be detected accurately with a small circuit area. The temperature information detected by the temperature detector 12 is sent to the controller 6 via the signal transmission cable 2. The controller 6 transmits the temperature information to the temperature control unit 9. The temperature control unit 9 may be built in, for example, the host device. The temperature and the amount of the refrigerant 7 that cools the first substrate 3 may be controlled by a command from the host device.

In the second example of FIG. 5B, among the plurality of stacked memory chips 11, the temperature detectors 12 are provided inside some memory chips 11, and the temperature detector 12 is also provided on the upper surface of the uppermost memory chip 11 and the first substrate 3. Although not illustrated in FIG. 5B, the temperature detector 12 may be provided on the surface of the package 13. In this way, by providing the temperature detector 12 not only inside the memory chip 11 but also inside the package, on the surface of the package, and on the first substrate 3, the temperature of the plurality of stacked memory chips 11 can be detected accurately.

As described above, the first substrate 3 is set to a temperature of −40[° C.] or lower, but for example, the heat conductivity at a temperature close to −40[° C.] is lower than the heat conductivity at a temperature of −100[° C.] or lower. Therefore, for example, in a case where the first substrate 3 is set to a temperature close to −40[° C.], the temperature detector 12 is provided at a location other than the inside of the memory chip 11 as in FIG. 5B to estimate the temperature of each memory chip 11, and in a case where the first substrate 3 is set to an extremely low temperature having a sufficiently high heat conductivity, the temperature detector 12 may be provided only inside some memory chips 11 as in FIG. 5A.

The temperature detector 12 arranged on the upper surface of the memory chip 11 or on the first substrate 3 of FIG. 5B may be, for example, a thermocouple in which two different metals are connected. By measuring the temperature using the thermocouple, the temperature can be detected accurately with a small circuit area.

[NAND Flash Memory]

Figure 6:
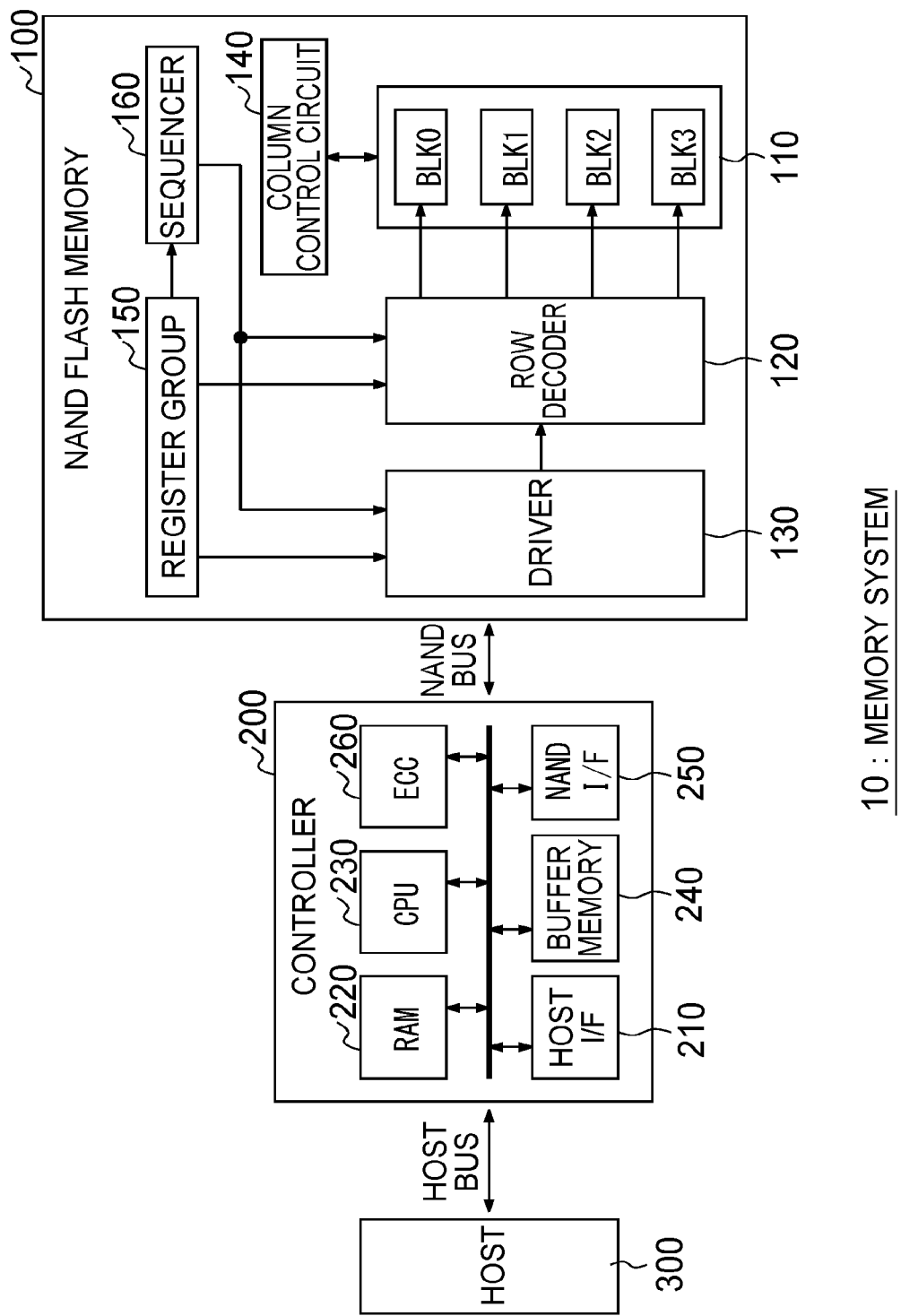
FIG. 6 is a block diagram illustrating a configuration of a NAND flash memory 100.

As the memory 5 according to the present embodiment, the NAND flash memory 100 having a low bit unit price can be used. The NAND flash memory 100 and a controller 200 corresponding to the controller 6 of FIG. 1 can constitute the SSD. FIG. 6 is a block diagram illustrating a schematic configuration of the SSD. As illustrated in FIG. 1, the NAND flash memory 100 is mounted on the first substrate 3, and the controller 200 is mounted on the second substrate 4.

The NAND flash memory 100 includes a plurality of memory cells and stores data in a non-volatile manner. The controller 200 is connected to the NAND flash memory 100 by a NAND bus provided in the signal transmission cable 2 illustrated in FIG. 1, and is connected to a host device 300 by a host bus. Then, the controller 200 controls the NAND flash memory 100, and accesses the NAND flash memory 100 in response to an instruction received from the host device 300. The host device 300 is, for example, an electronic device such as a personal computer, and the host bus is, for example, a bus that follows an interface such as PCI Express (PCIe) (registered trademark), Universal Flash Storage (UFS), and Ethernet (registered trademark). The NAND bus transmits and receives signals according to a NAND interface such as Toggle IF.

The controller 200 includes a host interface circuit 210, an internal memory (RAM) 220, a processor (CPU) 230, a buffer memory 240, a NAND interface circuit 250, and an Error checking and correcting (ECC) circuit 260.

The host interface circuit 210 is connected to the host device 300 via the host bus, and transfers instructions and data received from the host device 300 to the CPU 230 and the buffer memory 240, respectively. Further, the data in the buffer memory 240 is transferred to the host device 300 in response to the instruction of the CPU 230.

The CPU 230 controls the operation of the entire controller 200. For example, when the CPU 230 receives a write instruction from the host device 300, in response to the write instruction, the CPU 230 issues a write instruction to the NAND interface circuit 250. The same applies to the reading and erasing. The CPU 230 also executes various processes for managing the NAND flash memory 100, such as wear leveling. The operation of the controller 200 described below may be realized by the CPU executing the firmware, or may be realized by hardware.

The NAND interface circuit 250 is connected to the NAND flash memory 100 via the NAND bus in the signal transmission cable 2, and performs communication with the NAND flash memory 100. The NAND interface circuit 250 transmits various signals to the NAND flash memory 100 and receives various signals from the NAND flash memory 100 on the basis of the instructions received from the CPU 230. The buffer memory 240 temporarily holds write data and read data.

The RAM 220 is, for example, a semiconductor memory such as DRAM or SRAM, and is used as a work area of the CPU 230. The RAM 220 holds firmware for managing the NAND flash memory 100, various management tables, and the like.

The ECC circuit 260 performs error detection and error correction processes on the data stored in the NAND flash memory 100. That is, the ECC circuit 260 generates an error correction code when writing data, assigns the error correction code to the write data, and decodes the error correction code when reading the data.

Next, the configuration of the NAND flash memory 100 will be described. FIG. 6 is a block diagram of memory systems 1, 1a, 1b, and is including the NAND flash memory 100. As illustrated in FIG. 6, the NAND flash memory 100 includes a memory cell array 110, a row decoder 120, a driver circuit 130, a column control circuit 140, a register group 150, and a sequencer 160.

The memory cell array 110 includes a plurality of blocks BLK including a plurality of non-volatile memory cells associated with rows and columns. In FIG. 6, four blocks BLK0 to BLK3 are illustrated as an example. The memory cell array 110 stores the data given by the controller 200.

The row decoder 120 selects one of the blocks BLK0 to BLK3, and further selects a row direction in the selected block BLK. The driver circuit 130 supplies voltage to the selected block BLK via the row decoder 120.

When reading data, the column control circuit 140 senses the data read from the memory cell array 110, and performs necessary operations. Then, this data is output to the controller 200. When writing data, the write data received from the controller 200 is transferred to the memory cell array 110.

The register group 150 has an address register, a command register, and the like. The address register holds the address received from the controller 200. The command register holds the command received from the controller 200.

The sequencer 160 controls the operation of the entire NAND flash memory 100 on the basis of various kinds of information held in the register group 150.

Figure 7:
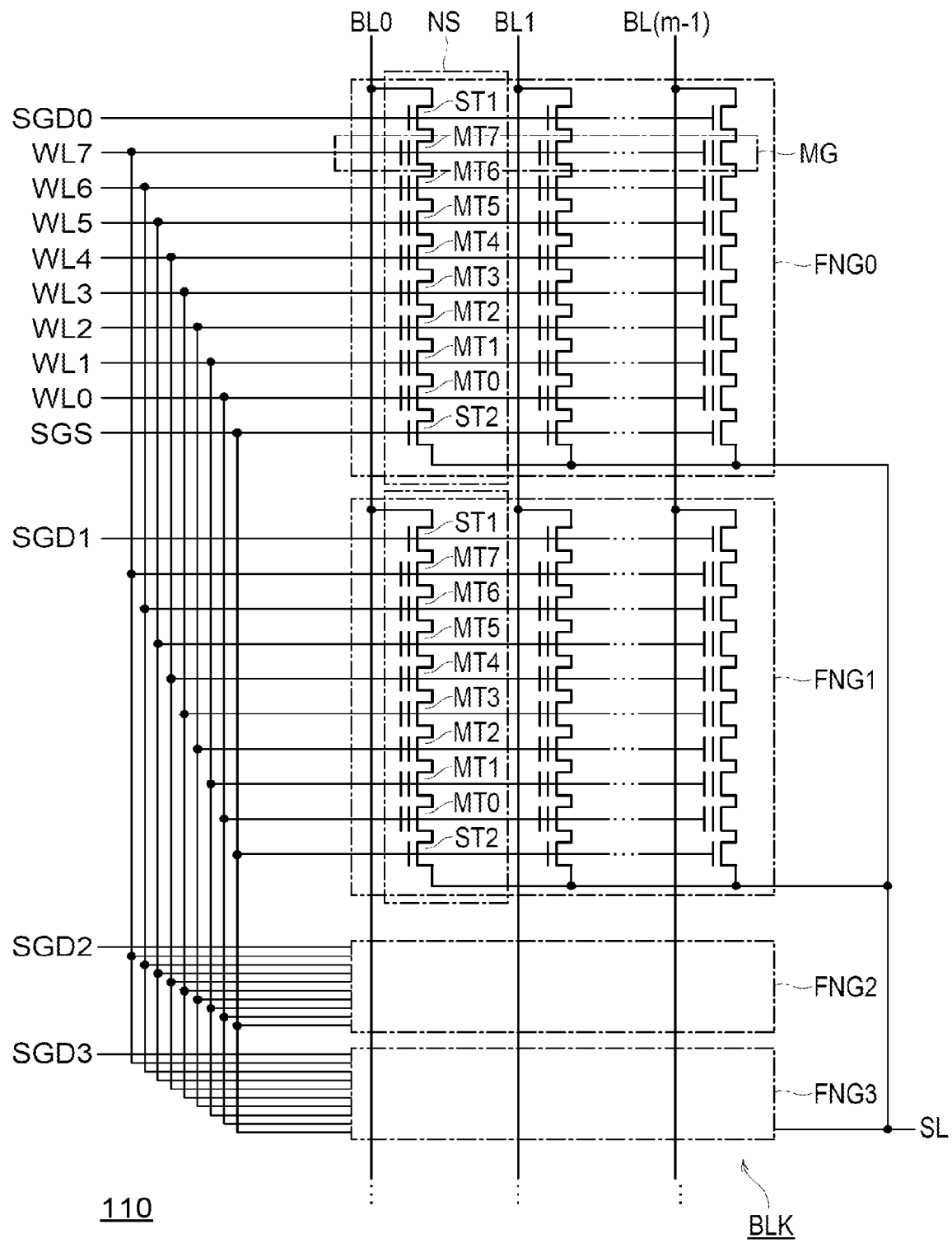
FIG. 7 is a circuit diagram illustrating an example of a NAND flash memory cell array having a three-dimensional structure.

FIG. 7 is a circuit diagram illustrating an example of the NAND flash memory cell array 110 having a three-dimensional structure. FIG. 7 illustrates the circuit configuration of one block BLK among the plurality of blocks in the NAND flash memory cell array 110 having the three-dimensional structure. The other blocks of the NAND flash memory cell array 110 also have the same circuit configuration as that in FIG. 7. The present embodiment can also be applied to a memory cell having a two-dimensional structure.

As illustrated in FIG. 7, the block BLK has, for example, four fingers FNG (FNG0 to FNG3). Also, each finger FNG includes a plurality of NAND strings NS. Each of the NAND strings NS has, for example, eight memory cell transistors MT (MT0 to MT7) connected in cascade, and selection transistors ST1 and ST2. In the present specification, each finger FNG may be called a string St.

The number of memory cell transistors MT in the NAND string NS is not limited to eight. The memory cell transistors MT are arranged so that the current paths are connected in series between the selection transistors ST1 and ST2. The current path of the memory cell transistor MT7 on one end side of this series connection is connected to one end of the current path of the selection transistor ST1, and the current path of the memory cell transistor MT0 on the other end side of this series connection is connected to one end of the current path of the selection transistor ST2.

The gates of the selection transistors ST1 of the respective fingers FNG0 to FNG3 are commonly connected to the select gate lines SGD0 to SGD3, respectively. On the other hand, the gates of the selection transistor ST2 are commonly connected to the same select gate line SGS among the plurality of fingers FNG. Further, the control gates of the memory cell transistors MT0 to MT7 in the same block BLK are commonly connected to word lines WL0 to WL7, respectively. That is, the word lines WL0 to WL7 and the select gate line SGS are commonly connected between the plurality of fingers FNG0 to FNG3 in the same block BLK, whereas the select gate lines SGD are independent for each of the fingers FNG0 to FNG3 even in the same block BLK.

The word lines WL0 to WL7 are connected to the control gate electrodes of the memory cell transistors MT0 to MT7 constituting the NAND string NS, respectively, and the i-th memory cell transistors MTi (i=0 to n) in the respective NAND strings NS in the same finger FNG are commonly connected by the same word line WLi (i=0 to n). That is, the control gate electrodes of the memory cell transistors MTi in the same row in the block BLK are connected to the same word line WLi.

Each NAND string NS is connected to the word line WLi as well as to the bit line. Each memory cell in each NAND string NS can be identified by an address that identifies the word line WLi and the select gate lines SGD0 to SGD3 and an address that identifies the bit line. As described above, the data of the memory cells (memory cell transistors MT) in the same block BLK is collectively erased. On the other hand, data is read and written in units of physical sector MS. One physical sector MS includes a plurality of memory cells that are connected to one word line WLi and belong to one finger FNG.

The controller 200 writes (programs) in units of all NAND strings NS connected to one word line in one finger. Therefore, the unit of the amount of data programmed by the controller 200 is 4 bits×the number of bit lines.

During the read operation and the program operation, one word line WLi and one select gate line SGD are selected and the physical sector MS is selected according to the physical address. In this specification, writing data to a memory cell is called programing as necessary.

Figure 8:
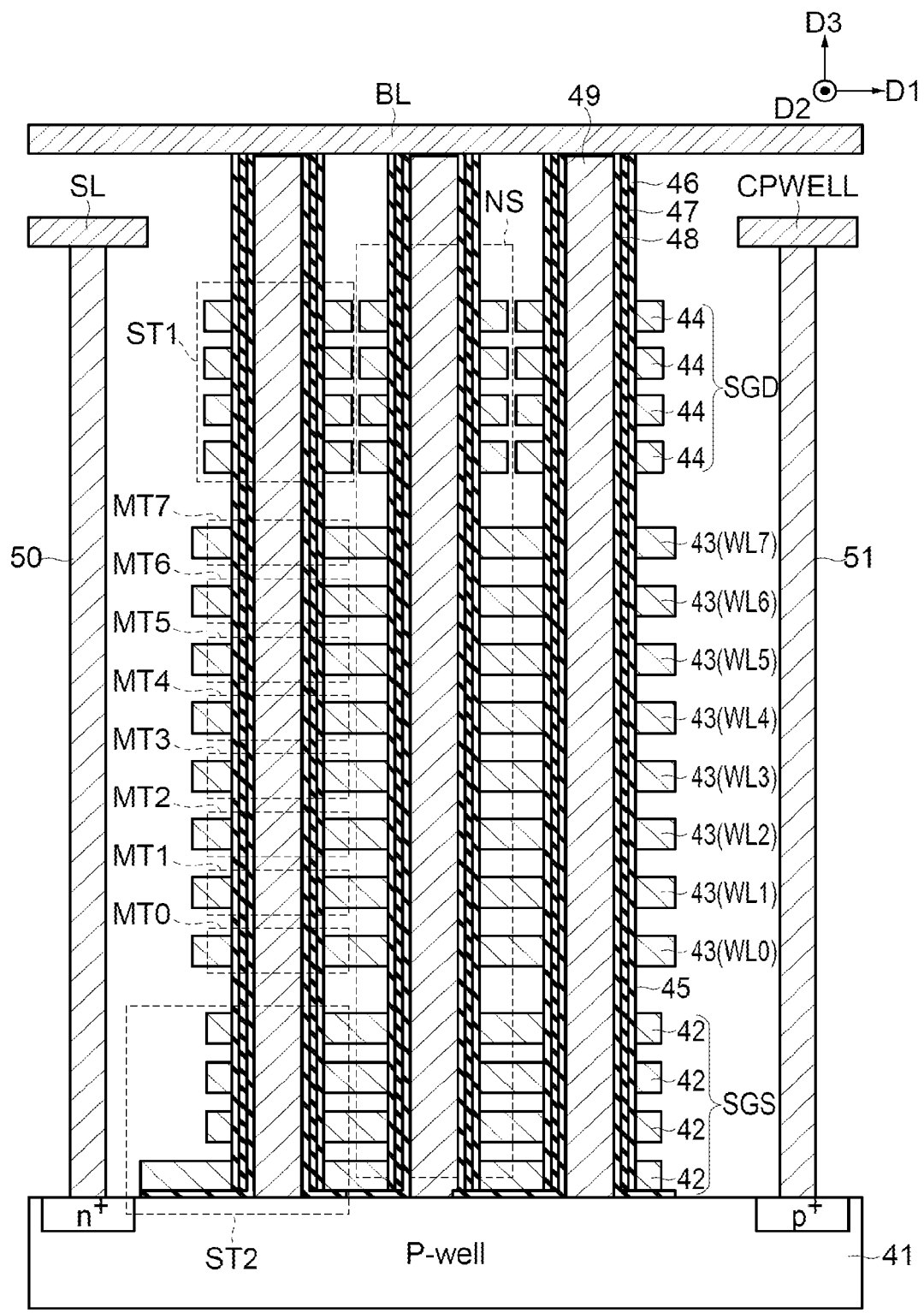
FIG. 8 is a sectional view of a partial region of the NAND flash memory cell array of the NAND flash memory having the three-dimensional structure.

FIG. 8 is a sectional view of a partial region of the NAND flash memory cell array 110 of the NAND flash memory 100 having the three-dimensional structure. As illustrated in FIG. 8, a plurality of NAND strings NS are formed in a vertical direction on a p-type well region (P-well) 41 of the semiconductor substrate. That is, on the p-type well region 41, a plurality of wiring layers 42 functioning as the select gate line SGS, a plurality of wiring layers 43 functioning as the word line WLi, and a plurality of wiring layers 44 functioning as the select gate line SGD are formed in the vertical direction.

A memory hole 45 is formed which penetrates the wiring layers 42, 43, and 44 and reaches the p-type well region 41. A block insulating film 46, a charge storage layer 47, and a gate insulating film 48 are sequentially formed on the side surface of the memory hole 45, and a conductive film 49 is further embedded in the memory hole 45. The conductive film 49 functions as the current path of the NAND string NS, and is a region where channels are formed during the operation of the memory cell transistors MT and the selection transistors ST1 and ST2. The charge storage layer 47 may be formed of a charge trap film or may be formed of a floating gate.

In each NAND string NS, the selection transistor ST2, the plurality of memory cell transistors MT, and the selection transistor ST1 are sequentially stacked on the p-type well region 41. A wiring layer that functions as the bit line BL is formed on the upper end of the conductive film 49.

Further, an n+ type impurity diffusion layer and a p+ type impurity diffusion layer are formed in the surface of the p-type well region 41. A contact plug 50 is formed on the n+ type impurity diffusion layer, and a wiring layer that functions as a source line SL is formed on the contact plug 50. A contact plug 51 is formed on the p+ type impurity diffusion layer, and a wiring layer that functions as a well wiring CPWELL is formed on the contact plug 51. The well wiring CPWELL is used to apply the erasing voltage.

A plurality of NAND flash memory cell arrays 110 illustrated in FIG. 8 are arranged in a depth direction of the paper surface of FIG. 8, and one finger FNG is formed by a set of a plurality of NAND strings NS arranged in a row in the depth direction. The other fingers FNG are formed, for example, in the left-right direction in FIG. 8. FIG. 7 illustrates four fingers FNG0 to FNG3, but FIG. 8 illustrates an example in which three fingers are arranged between the contact plugs 50 and 51.

Figure 9:
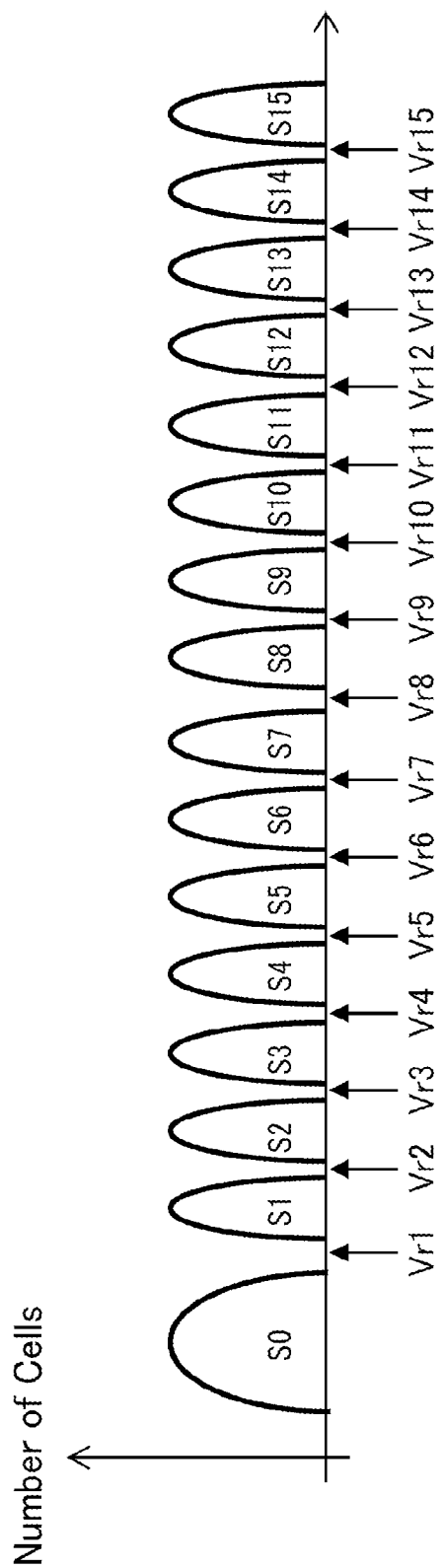
FIG. 9 is a diagram illustrating an example of a threshold distribution of a memory cell transistor in an SSD according to the present embodiment.

FIG. 9 is a diagram illustrating an example of a threshold distribution of the memory cell transistor MT in the SSD according to the present embodiment. FIG. 9 illustrates an example of the distribution of threshold regions of the non-volatile memory 5 of 4-bit/Cell (Quadruple Level Cell (QLC)). In the non-volatile memory 5, information is stored by the charge amount of the electrons stored in the charge storage layer 47 of the memory cell. Each memory cell has a threshold voltage according to the charge amount of the electrons. A plurality of data values stored in the memory cell are associated with a plurality of regions (threshold regions) having different threshold voltages.

Regions S0 to S15 in FIG. 9 indicate threshold distributions within 16 threshold regions. The horizontal axis of FIG. 9 represents the threshold voltage, and the vertical axis represents the number of memory cells (number of cells). The threshold distribution is a range in which the threshold fluctuates. Thus, each memory cell has 16 threshold regions separated by 15 boundaries, and each threshold region has a unique threshold distribution. Vr1 to Vr15 are threshold voltages that serve as boundaries between the threshold regions.

In the non-volatile memory 5 such as the NAND flash memory 100, a plurality of data values are associated with the plurality of threshold regions of the memory cell. This correspondence is called data coding. This data coding is defined in advance, and at the time of writing data (programming), the charges are injected into the charge storage layer 47 in the memory cell so as to be within the threshold region corresponding to the data value to be stored according to the data coding. Then, at the time of reading, a read voltage is applied to the memory cell, and the data logic is determined depending on whether the threshold of the memory cell is lower or higher than the read voltage.

At the time of reading data, the data logic is determined depending on whether the threshold of the memory cell as a read target is lower or higher than a read level of the boundary of the read target. In a case where the threshold is the lowest, it is in an "erased" state, and the data of all bits is defined as "1". In a case where the threshold is higher than the "erased" state, it is in a "programmed" state and the data is defined as "1" or "0" according to the coding.

[Wire Bonding]

As described above, the first substrate 3 is set to a temperature of −40[° C.] or lower, but in a case where the plurality of memory chips 11 are laminated on the first substrate 3, it is necessary to connect the pad of the memory chip 11 of each layer and the pin for external connection of the package with a bonding wire. In a state where the temperature is set to −40[° C.] or lower, the bonding wire shrinks to cause compressive stress to act, the bonding force between the bonding wire and the pad (pin) becomes weaker, and in some cases, the bonding wire comes off from the pad (pin), so that there is a risk that the bonding wire will be broken. In particular, in a case where the periphery of the bonding wire is covered with a resin, since the heat shrinkage rate at a low temperature differs between the resin and the metal, the bonding wire is likely to be broken or poorly connected due to the difference in the heat shrinkage rate between the resin and the metal.

Figure 10:
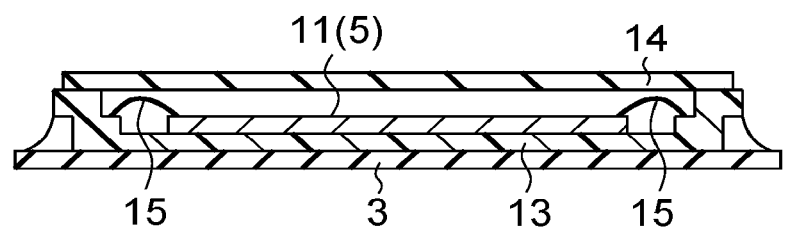
FIG. 10 is a sectional view illustrating an example in which hollow bonding is performed when a pad of a memory chip and a pin of a package are connected by a bonding wire.

Therefore, in the present embodiment, hollow bonding can be adopted. FIG. 10 is a sectional view illustrating an example in which hollow bonding is performed when the pad of the memory chip 11 and the pin of the package 13 are connected by a bonding wire 15. In the example of FIG. 10, the periphery of the memory chip 11 is not covered with the resin member and is hollow. The memory chip 11 is arranged in a recess of the package 13, and a lid member 14 for sealing the package 13 is arranged above the memory chip 11 in the recess. The bonding wire 15 is arranged in a hollow portion surrounded by the lid member 14, the package 13, and the memory chip 11. The hollow portion may be evacuated or may be purged of a specific gas (for example, nitrogen). As illustrated in FIG. 10, by performing hollow bonding so that the periphery of the bonding wire 15 is not covered with the resin, it is possible to prevent disconnection and poor connection of the bonding wire 15 due to the difference in heat shrinkage rate between the resin member and the metal member.

Although FIG. 10 illustrates an example in which the single-layer memory chip 11 is arranged in the recess of the package 13, a plurality of stacked memory chips 11 may be arranged. In a case where the plurality of memory chips 11 are stacked, it is desirable to pull out the bonding wires 15 evenly from the four sides of the rectangular memory chips 11 as illustrated in the perspective view of FIG. 11A. As a result, the memory chips 11 are supported from all four sides with substantially the same force, the stress is not biased, excessive stress is not applied to some of the bonding wires 15, and problems such as disconnection of the bonding wires 15 can be prevented.

Figure 11A:
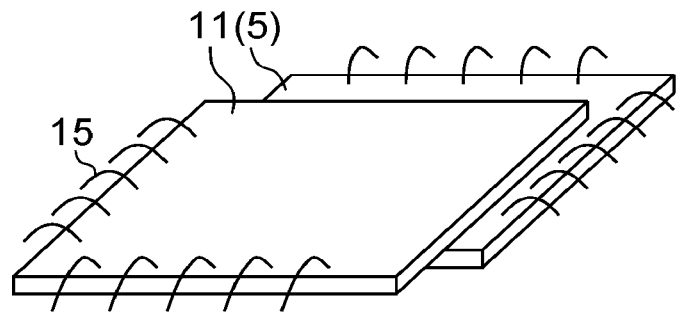
FIG. 11A is a perspective view illustrating a state in which a plurality of memory chips are stacked.
Figure 11B:
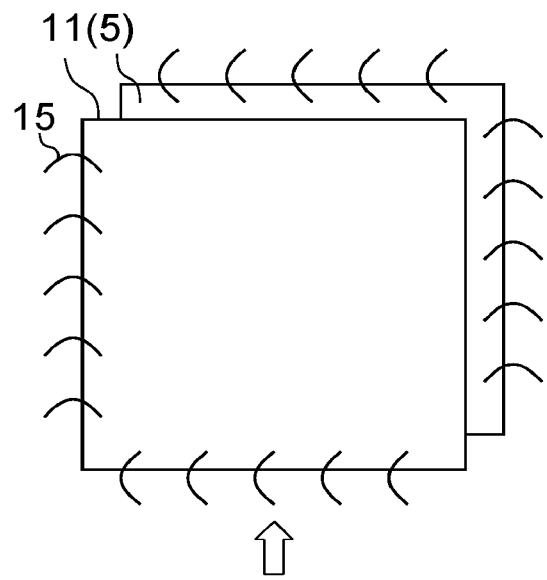
FIG. 11B is a plan view of the stacked chips of FIG. 11A as viewed from a normal direction of a chip surface.
Figure 11C:
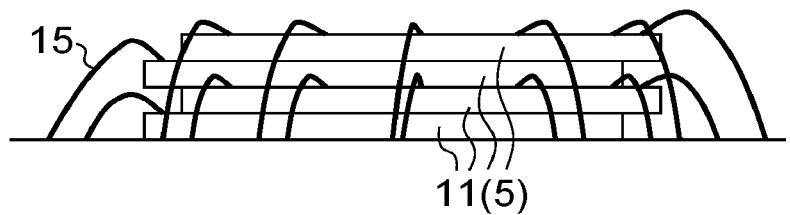
FIG. 11C is a side view seen from an arrow direction of FIG. 11B.

FIG. 11B is a plan view of the stacked chips of FIG. 11A as viewed from a normal direction of a chip surface, and FIG. 11C is a side view seen from an arrow direction of FIG. 11B. FIG. 11A and FIG. 11B illustrate a state in which two memory chips 11 are stacked for simplification, whereas FIG. 11C illustrates a state in which four memory chips 11 are stacked. As illustrated in the drawings, by stacking the memory chips 11 with a step, the bonding wires 15 of the memory chips 11 with an even stacking order are pulled out in the same direction, and the bonding wires 15 of the memory chips 11 with an odd stacking order are pulled out to the other side. In each layer, the bonding wires 15 are pulled out from two adjacent sides of the four sides, and when the two memory chips 11 are stacked, the bonding wires 15 are pulled out evenly in the four side directions so that stress is evenly applied to the bonding wires 15. Further, hollow bonding is possible for any of the bonding wires 15, and the bonding wire 15 can be prevented from being broken.

[Manufacturing Procedure of Memory System]

Figure 12:
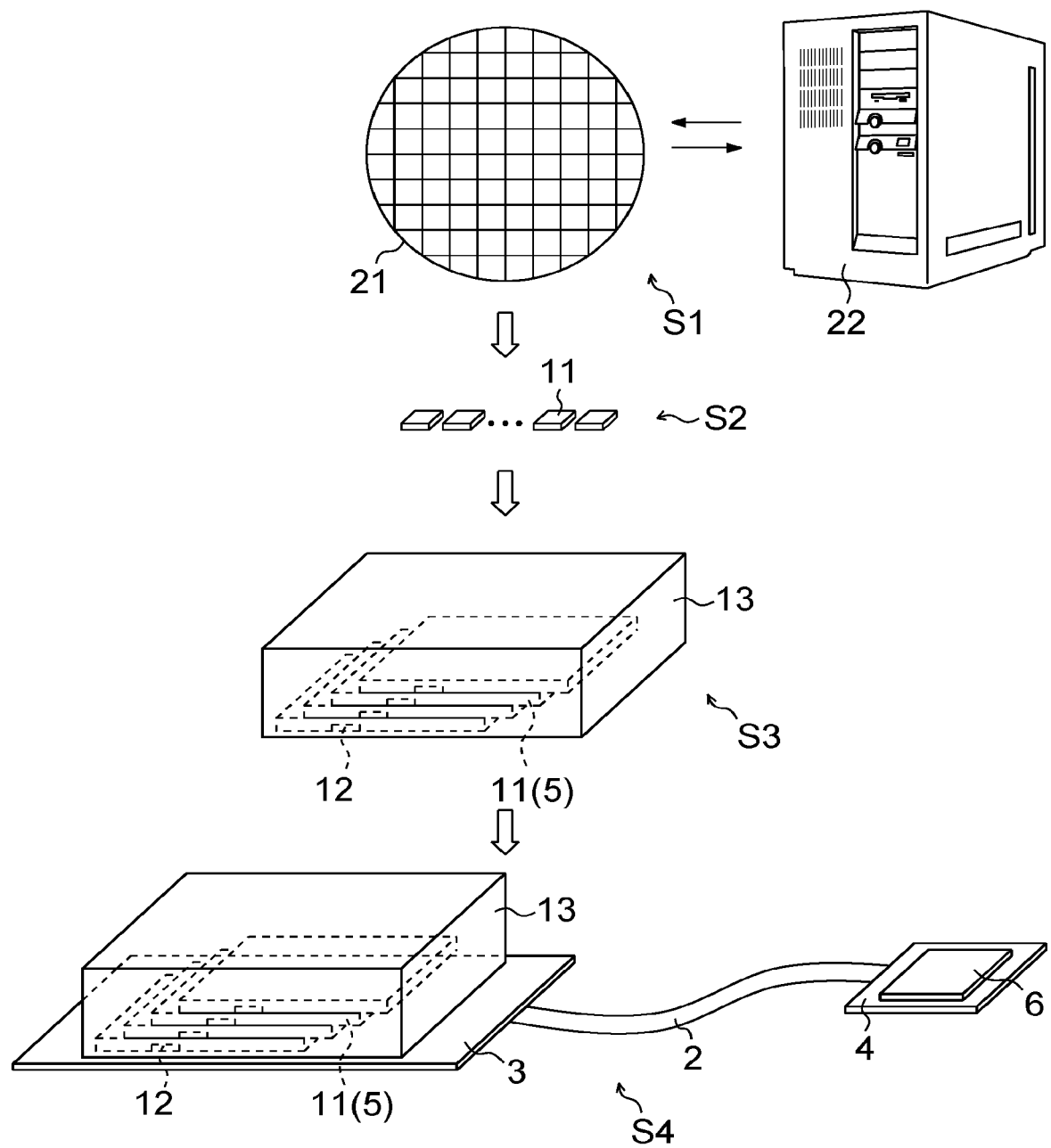
FIG. 12 is a process diagram schematically illustrating a procedure for manufacturing the memory system illustrated in FIG. 1.

FIG. 12 is a process diagram schematically illustrating a procedure for manufacturing the memory systems 1, 1a, 1b, and 1c illustrated in FIG. 1. In a manufacturing process of the semiconductor device, electrical characteristics and the like are inspected using a semiconductor tester 22 in a state of a wafer 21. The semiconductor tester 22 generally has a guaranteed operating temperature in a temperature range of 0[° C.] to 85[° C.], and operation is guaranteed up to −40[° C.] only for the semiconductor tester 22 that inspects special semiconductor devices that are operated at a temperature up to −40[° C.]. In the present embodiment, since the first substrate 3 on which the memory 5 is mounted is set to −40[° C.] or lower, the existing semiconductor tester 22 cannot be used for inspection under the temperature condition. It can be very time consuming and costly to develop a semiconductor tester 22 that can perform inspection at a temperature of −40[° C.] or lower. Therefore, in the present embodiment, as illustrated in the process diagram of FIG. 12, the memory 5 mounted on the first substrate 3 is inspected at the guaranteed operating temperature (for example, temperature range of 0[° C.] to 85[° C.]) of the semiconductor tester 22, using the existing semiconductor tester 22 in a state of the wafer 21 before dicing (step S1). The wafer 21 that has passed the inspection is diced to be separated into individual memory chips 11 (step S2), and packaging is performed (step S3). After that, the packaged memory 5 is mounted on the first substrate 3, and the controller 6 is mounted on the second substrate 4 (step S4). After that, the first substrate 3 on which the memory chip 11 is mounted is subjected to the inspection set at −40[° C.] or lower.

Information required for the operation of the NAND flash memory 100 may be written to a part of the memory area (hereinafter, referred to as a ROM block) used as the ROM in the NAND flash memory 100 when the inspection is performed by the semiconductor tester 22 in step S1 of FIG. 12. The data in the ROM block has to be read normally even at an extremely low temperature. For that purpose, it is necessary to write the data in the ROM block, keeping in mind in advance that a temperature (for example, room temperature) of the semiconductor inspection process for writing the data to the ROM block should be lowered to a temperature (for example, 77[K]) of −40[° C.] or lower in actual use.

[Writing to ROM Block]

Figure 13:
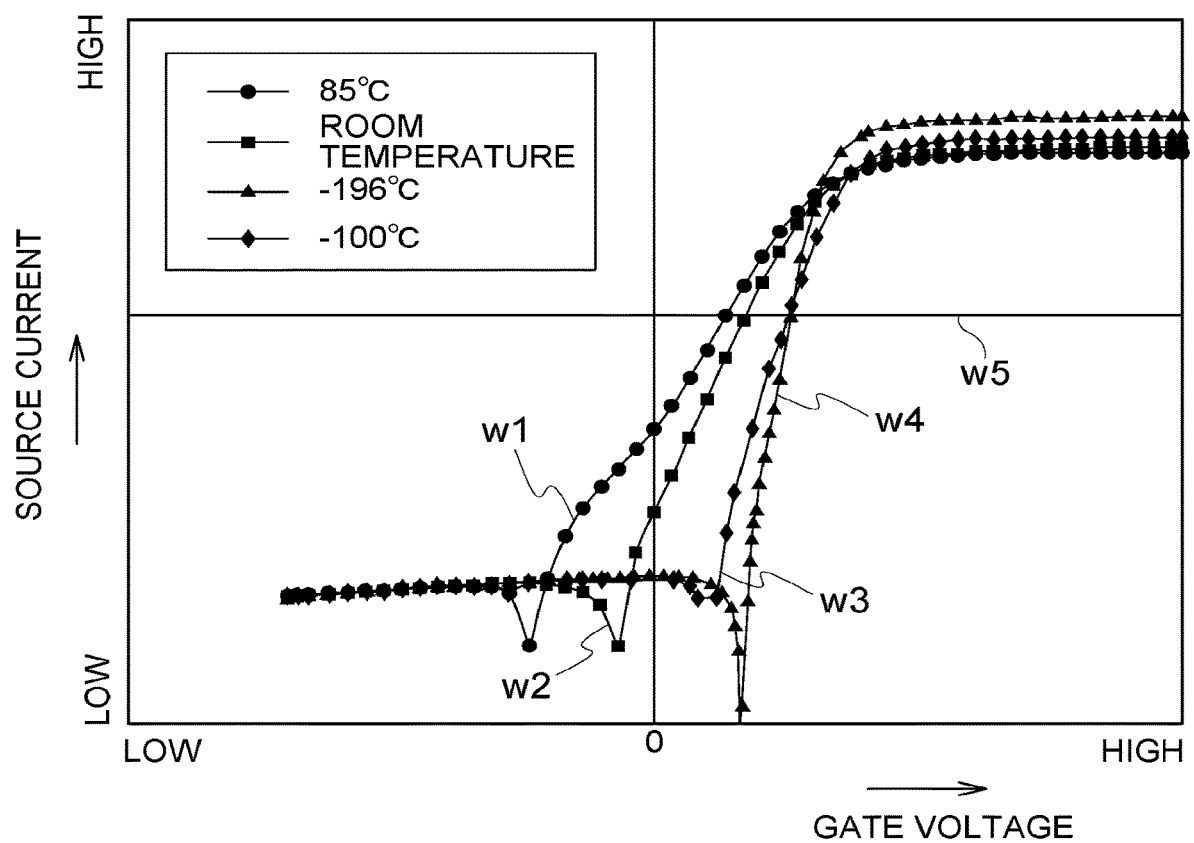
FIG. 13 is a diagram illustrating IV characteristics of the NAND flash memory used in the memory system according to the present embodiment.

FIG. 13 is a diagram illustrating IV characteristics of the memory cell transistor of the NAND flash memory 100 used in the memory systems 1, 1a, 1b, and 1c according to the present embodiment. The horizontal axis of FIG. 13 represents the gate voltage, and the vertical axis represents the source current. FIG. 13 illustrates IV characteristic curves in a case where the temperature of the NAND flash memory 100 is changed. A waveform w1 is in a case of 85[° C.], a waveform w2 is in a case of room temperature (RT), a waveform w3 is in a case of 77[K] (−196[° C.]), and a waveform w4 is in a case of −100[° C.].

A waveform w5 in FIG. 13 illustrates a reference source current (for example, 1 nanoampere). The gate voltage at each intersection of the waveforms w1 to w4 and the waveform w5 is the threshold voltage (Vth) of the memory cell transistor, and the difference of the gate voltage between room temperature and 77[K] is about 1 V. Specifically, the threshold voltage at 77[K] is shifted to a value about 1 V higher than the threshold voltage at room temperature. This means that the lower the temperature, the higher the threshold voltage of the NAND flash memory 100. Therefore, in the semiconductor inspection process, when the setting information is written to the ROM block in each NAND flash memory 100 in the state of the wafer 21, the data is written such that the threshold voltage is about 1 V lower than the threshold voltage at room temperature, keeping in mind that the data in the ROM block is read out at a temperature of −40[° C.] or lower (for example, 77[K]). As a result, when the temperature is set to −40[° C.] or lower, the threshold voltage is increased, so that errors are reduced and data can be read normally.

In addition, in a state where the first substrate 3 on which the memory 5 is mounted is set to a temperature of −40[° C.] or lower (for example, 77[K]), the data in the NAND flash memory 100 is read, error correction is performed on the data, and the data after error correction may be stored in the NAND flash memory 100 again. As a result, in a case where the data on which the error correction has been performed at an extremely low temperature is stored in the NAND flash memory 100 at that temperature, since the threshold voltage does not fluctuate as long as the same temperature conditions are set, the frequency of error occurrence at the time of subsequent data reading can be reduced.

When data is written to the NAND flash memory 100, the temperature information at the time of writing may also be written. As illustrated in FIG. 13, the threshold voltage of the NAND flash memory 100 fluctuates depending on the temperature. Therefore, in a case where the first substrate 3 is set to a specific temperature of −40[° C.] or lower, it is possible to grasp the threshold voltage of the NAND flash memory 100 at a specific temperature on the basis of a temperature when the data is written to the NAND flash memory 100 and a specific temperature of −40[° C.] or lower.

The data written to the NAND flash memory 100 has a reduced holding characteristic with time, and there is a high possibility that a retention error will occur. Therefore, in a case where the first substrate 3 on which the memory 5 is mounted is set to a temperature of −40[° C.] or lower, it is desirable to write data to the ROM block or the like immediately before the temperature is set to −40[° C.] or lower.

In a case where the first substrate 3 on which the memory 5 is mounted illustrated in FIG. 1 is used under a plurality of temperature conditions, a plurality of memory areas corresponding to the plurality of temperature conditions may be provided in the memory 5. As a more specific example, a block for writing/reading at a temperature condition of −40[° C.] or higher and a block for writing/reading at 77[K] (about 196[° C.]) may be provided in the NAND flash memory 100. When data is written to each block, a write voltage can be adjusted in consideration of the read temperature.

Figure 15:
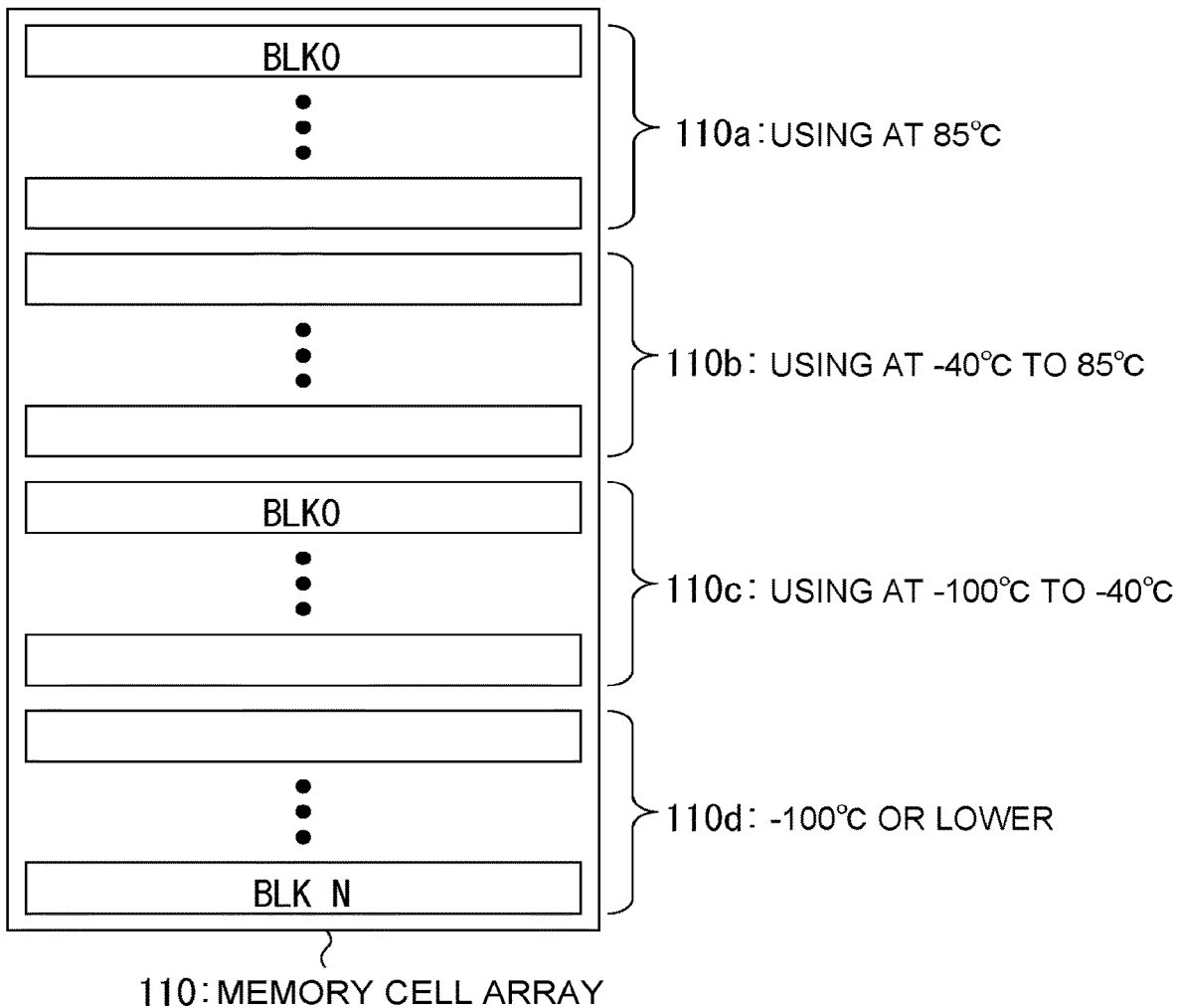
FIG. 15 is a diagram illustrating an example of an internal configuration of a memory cell array having a plurality of memory areas corresponding to a plurality of temperature conditions.

FIG. 15 is a diagram illustrating an example of an internal configuration of the memory cell array 110 having the plurality of memory areas corresponding to the plurality of temperature conditions. The memory cell array 110 of FIG. 15 has a memory area 110a used at a temperature of 85[° C.] or higher, a memory area 110b used at a temperature of −40[° C.] to 85[° C.], a memory area 110c used at a temperature of −100[° C.] to −40[° C.], and a memory area 110d used at a temperature of −100[° C.] or lower.

The NAND flash memory is provided in each of the memory areas 110a to 110d of FIG. 15, but access conditions may be changed for each of the memory areas 110a to 110d. Here, the access condition is a write voltage, a write pulse width, or the like. Since the memory areas 110a to 110d are used at temperatures different from each other, it is desirable to optimize the access conditions so that reading and writing can be performed normally and stably at the temperature used.

[Characteristic Improvement by Heat Treatment]

Figure 14:
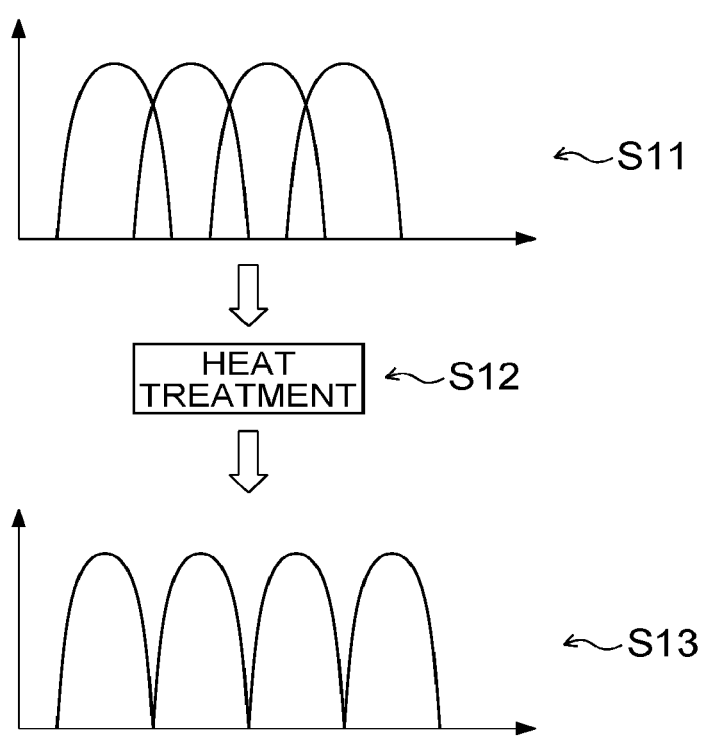
FIG. 14 is a diagram illustrating a procedure for countermeasures against a problem that threshold voltage distributions overlap.

The NAND flash memory 100 has a problem that adjacent threshold voltage distributions overlap when reading and writing are repeated. FIG. 14 is a diagram illustrating a procedure for countermeasures against a problem that threshold voltage distributions overlap. In a case where adjacent threshold voltage distributions overlap as in step S11 of FIG. 14, the NAND flash memory 100 is subjected to the heat treatment at a high temperature for a predetermined time while being covered with the package 13 (step S12), so that the overlapping of the threshold voltage distributions can be eliminated (step S13).

Figure 16:
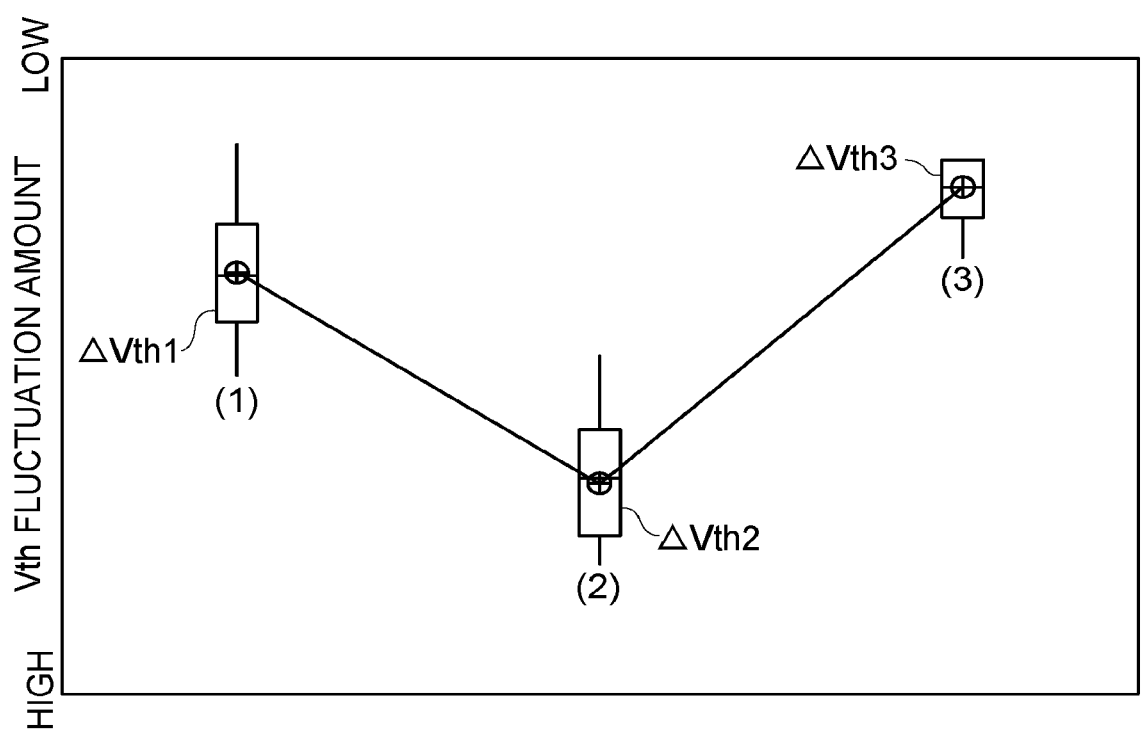
FIG. 16 is a diagram illustrating fluctuation characteristics of the threshold voltage of the NAND flash memory before and after heat treatment is performed at 250[° C.] for 2 hours.

FIG. 16 is a diagram illustrating fluctuation characteristics of the threshold voltage of the NAND flash memory 100 before and after heat treatment is performed at 250[° C.] for 2 hours. FIG. 16 illustrates the threshold fluctuations $\Delta Vth1$ to $\Delta Vth3$ before and after the heat treatment under three writing conditions (1) to (3). The $\Delta Vth1$ in (1) is the threshold fluctuation in a case where reading and writing are performed only once in the initial state. The $\Delta Vth2$ in (2) is the threshold fluctuation after reading and writing are repeated 1200 times from the initial state. The $\Delta Vth3$ in (3) is the threshold fluctuation after heat treatment is performed at 250[° C.] for 2 hours.

The fluctuation of the threshold voltage becomes large by repeating reading and writing, but as illustrated in FIG. 16, the fluctuation of the threshold voltage of the NAND flash memory 100 can be suppressed and the initial state can be restored again by performing the heat treatment. In a case where the NAND flash memory 100 is used at a temperature of −40[° C.] or lower as in the present embodiment and the overlapping of the threshold voltage distributions of the memory cell transistor becomes large by repeating the reading and writing a certain number of times, the NAND flash memory 100 can be used again in the environment of −40[° C.] or lower by being taken out of the environment of −40[° C.] or lower and being subjected to the heat treatment at a high temperature to return to the initial characteristics.

As described above, in the present embodiment, since the reading and writing can be normally performed with respect to the NAND flash memory 100 even at a temperature of −40[° C.] or lower and the controller 6 can be operated normally in a case where the temperature is −40[° C.] or higher, as illustrated FIG. 1, the first substrate 3 on which the memory 5 is mounted is set to a temperature of −40[° C.] or lower, and the second substrate 4 which is connected to the first substrate 3 by the signal transmission cable 2 and on which the controller 6 is mounted is set to a temperature of −40[° C.] or higher. Since the controller 6 is operated at −40[° C.] or higher, the existing controller 6 can be used as it is, and the development cost can be suppressed. Since the controller 6 controls all the memories 5 mounted on the first substrate 3, the operating time is long, the power consumption is large, and the amount of heat generated is large. However, in the present embodiment, since the controller 6 is operated at a temperature of −40[° C.] or higher, the cooling cost of the entire memory system can be kept low without affecting the usage amount of the refrigerant 7 (for example, liquid nitrogen) used to cool the first substrate 3.

Further, since the first substrate 3 and the second substrate 4 are connected by the signal transmission cable 2, the heat of the controller 6 on the second substrate 4 is prevented from being transferred to the first substrate 3, the cooling cost can be suppressed, and the first substrate 3 can be maintained at a low temperature.

As a specific example of the present embodiment, the controller 6 can be operated by immersing the first substrate 3, on which the memory 5 is mounted, in liquid nitrogen that is inexpensive as the refrigerant 7, and by setting the second substrate 4 connected to the other end side of the signal transmission cable 2 connected to the first substrate 3, to a temperature of −40[° C.] or higher. Since the memory systems 1, 1a, 1b, and 1c can be constructed using the existing members without using particularly expensive members, the development cost and the cooling cost can be suppressed.

Since it is assumed that the reading and writing with respect to the memory 5 is performed at an extremely low temperature of −40[° C.] or lower, the memory systems 1, 1a, 1b, and 1c according to the present embodiment can be applied to the memory 5 used by a quantum computer, for example. A large amount of storage memory can be placed near the quantum bits of the quantum computer and the CPU that controls the quantum bits. In the memory systems 1, 1a, 1b, and 1c according to the present embodiment, the controller 6 mounted on the second substrate 4 is operated at −40[° C.] or higher, but the first substrate 3 and the second substrate 4 block heat by the signal transmission cable 2, and thus it is possible to prevent the quantum computer and the control CPU from being affected by heat diffusion.

Further, the memory systems 1, 1a, 1b, and 1c according to the present embodiment can be used even at a place such as outer space where the temperature difference is very large. As described above, since a plurality of memory areas corresponding to a plurality of temperature conditions are provided in the memory 5 mounted on the first substrate 3, and the optimal threshold voltage for the corresponding temperature condition can be set in each memory area, the memory 5 can be used under a wide range of temperature conditions.

Further, since the NAND flash memory 5 with the lowest bit unit price can be used as the memory 5 mounted on the first substrate 3, and the existing controller 6 can be used, the member costs of the memory systems 1, 1a, 1b, and 1c according to the present embodiment can be kept low.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A memory system comprising:
a memory;
a first substrate on which the memory is mounted and which is set to a temperature of −40[° C.] or lower;
a controller configured to control the memory; and
a second substrate on which the controller is mounted, which is set to a temperature of −40[° C.] or higher, and which transmits and receives a signal to and from the first substrate via a signal transmission cable.

2. The memory system according to claim 1, further comprising:

a temperature controller configured to control a temperature of the first substrate on which the memory is mounted to −40[° C.] or lower.

3. The memory system according to claim 2,
wherein at least one of the memory and the first substrate comprises a temperature detector,
the controller transmits a temperature detected by the temperature detector to the temperature controller, and
the temperature controller controls the temperature of the first substrate on the basis of the temperature detected by the temperature detector.

4. The memory system according to claim 1,
wherein the memory is a non-volatile memory that holds charges in a floating gate or a charge trap film.

5. The memory system according to claim 4,
wherein the non-volatile memory comprises at least one of a NAND flash memory and a NOR flash memory.

6. The memory system according to claim 5,
wherein the non-volatile memory is a solid state drive (SSD) that has at least one of a built-in NAND flash memory and a built-in NOR flash memory.

7. The memory system according to claim 1,
wherein the memory comprises a built-in memory controller that is operated at a temperature of 77[K] or lower.

8. The memory system according to claim 1,
wherein the first substrate is immersed in liquid nitrogen.

9. The memory system according to claim 1, further comprising:
a package that has a plurality of pins for external connection and covers the memory; and
a plurality of hollow bonding wires which connect a plurality of pads of the memory and the plurality of pins.

10. The memory system according to claim 9,
wherein the memory is a stacked body in which a plurality of rectangular chips are stacked, and
the plurality of hollow bonding wires are evenly arranged in four side directions from the chip of each layer of the stacked body.

11. The memory system according to claim 1,
wherein the memory comprises a non-volatile storage that stores an operating condition of the memory, and
the non-volatile storage stores the operating condition at a temperature of −40[° C.] or higher in a semiconductor manufacturing or inspection process on the basis of a result of testing a wafer before being diced to the memory under a temperature condition of −40[° C.] or higher.

12. The memory system according to claim 11,
wherein the non-volatile storage stores the operating condition at a temperature of −40[° C.] or higher in a semiconductor manufacturing or inspection process on an assumption that reading of the non-volatile storage is performed at a temperature of −40[° C.] or lower, on the basis of the result of testing the wafer.

13. The memory system according to claim 12,
wherein the non-volatile storage stores the operating condition on an assumption that a threshold voltage is increased in a case where reading of the non-volatile storage is performed at a temperature of −40[° C.] or lower, more than in a case where reading of the non-volatile storage is performed at a temperature of −40[° C.] or higher.

14. The memory system according to claim 11,
wherein the controller reads, at a temperature of −40[° C.] or lower, the operating condition that is written in the non-volatile storage at a temperature of −40[° C.] or higher in a semiconductor manufacturing or inspection process, and writes the operating condition in the non-volatile storage again after error correction is performed.

15. The memory system according to claim 1, wherein the controller divides the memory into a plurality of storage areas, and stores data in the storage area according to a temperature at which the data is written to the memory.

16. The memory system according to claim 1, wherein in a case where characteristics of the memory deteriorate as a result of continuing to use the memory under a temperature condition of −40[° C.] or lower, an annealing treatment is continuously performed for a predetermined time under a predetermined temperature condition higher than normal temperature, and after the characteristics are restored by the annealing treatment, the memory is used again under the temperature condition of −40[° C.] or lower.

* * * * *